(12) United States Patent
Richardson et al.

(10) Patent No.: US 9,330,542 B1
(45) Date of Patent: May 3, 2016

(54) CONFIGURABLE COLORED INDICATOR ON COMPUTING DEVICE

(71) Applicant: GOOGLE INC., Mountain View, CA (US)

(72) Inventors: William F. Richardson, Santa Clara, CA (US); Andrew Bowers, San Francisco, CA (US); Neil Hendin, Mountain View, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 14/186,271

(22) Filed: Feb. 21, 2014

(51) Int. Cl.
*G08B 5/22* (2006.01)
*G09F 9/33* (2006.01)
*G08B 5/36* (2006.01)
*G01R 13/40* (2006.01)

(52) U.S. Cl.
CPC .............. *G08B 5/36* (2013.01); *G01R 13/405* (2013.01); *G01R 13/406* (2013.01); *G09F 9/33* (2013.01)

(58) Field of Classification Search
CPC .. G01R 13/405; G01R 13/406; G01R 13/408; G09F 9/33
USPC .......................... 340/815.45; 345/39, 40, 169
See application file for complete search history.

(56) References Cited

U.S. PATENT DOCUMENTS

| 7,221,331 | B2 * | 5/2007 | Bear et al. | 345/169 |
| 7,633,404 | B2 * | 12/2009 | Tseng | 340/815.4 |
| 8,902,245 | B2 * | 12/2014 | So | 345/39 |
| 2006/0007051 | A1 * | 1/2006 | Bear et al. | 345/1.1 |
| 2008/0024470 | A1 * | 1/2008 | Andre et al. | 345/204 |

* cited by examiner

*Primary Examiner* — John A Tweel, Jr.
(74) *Attorney, Agent, or Firm* — Brake Hughes Bellermann LLP

(57) ABSTRACT

A computing device includes a memory storing executable instructions, a processor configured to execute the instructions, a programmable display screen configured to display text-based information, and a multi-color indicator. The multi-color indicator is located on a surface of the computing device and includes a plurality of segments, each segment configured to display at least four different colors, where colors displayed by segments of the multi-color indicator are programmable, through execution of the instructions by the processor, to display non-text-based information.

21 Claims, 6 Drawing Sheets

CONFIGURABLE COLORED INDICATOR ON COMPUTING DEVICE

BACKGROUND

Computing devices such as laptops may have a light-emitting diode (LED) indicator on the front or back of the device, which may indicate an operating status of the device, such as the device being on, being in sleep mode, or charging. This LED indicator has a single color LED, and is driven by internal CPU controllers. However, the internal CPU controllers do not have the capabilities of controlling the LED indicator in a configurable manner to indicate many types of information besides the operating status of a computer.

SUMMARY

The details of one or more implementations are set forth in the accompanying drawings and the description below. Other features will be apparent from the description and drawings, and from the claims.

In a first aspect, a computing device includes a memory storing executable instructions, a processor configured to execute the instructions, a programmable display screen configured to display text-based information, and a multi-color indicator. The multi-color indicator is located on a surface of the computing device and includes a plurality of segments, each segment configured to display at least four different colors, where colors displayed by segments of the multi-color indicator are programmable, through execution of the instructions by the processor, to display non-text-based information.

Implementations can include one or more of the following features. For example, surface may not include the programmable display screen. The computing device can be a laptop computer that includes a base portion and a display portion, the display portion having a first surface that includes the programmable display screen and having a second surface opposite to the first surface that includes the multi-color indicator. The computing device can include a display screen apparatus having a first surface that includes the programmable display screen and having a second surface opposite to the first surface that includes the multi-color indicator. The plurality of segments each can be generally-rectangular, and the plurality of segments can be arranged in a line. The plurality of segments can be generally-rectangular, and the plurality of segments can be arranged in a line, where the line can be contiguous.

The computing device can be a laptop computer that includes a base portion and a display portion, the display portion having a first surface that includes the programmable display screen and having a second surface opposite to the first surface that includes the multi-color indicator, and wherein the line of segments spans has a length that is greater than 50% of a width of the display portion. The line of segments can have a height that is less than 10% of height of the display portion.

The instructions can include an Application Programming Interface to allow a user of the computing device to program the display of the multi-color indicator. The instructions can include a scripting language code, which, when executed by the processor, program the display of the multi-color indicator. Execution of the instructions by the processor can provide different levels of control of the display of the multi-color indicator to different types of users of the computing device. A timing of the colors displayed by the segments of the multi-color indicator can be programmable, through execution of the instructions by the processor, to display non-text-based information. Each segment can be configured to display at least eight different colors. Each segment can be configured to display at least 256 different colors.

In another general aspect, a method of displaying non-text-based information via a multi-segment, multi-color indicator of a computing device located on a surface of the computing device that does not include a programmable display screen configured to display text-based information includes receiving instructions from an application executing on the computing device, applying the instructions to the indicator via an API, and, in response to the application of the instruction, displaying, by the multi-segment, multi-color indicator, non-text-based information.

Implementations can include one or more of the following features. For example, the received instructions can include instructions to display information representing a brand associated with the computing device. The received instructions can include instructions to display information relevant to a gaming application executed by the computing device. The received instructions can include instructions to display information relevant to an operating status of the computing device. The received instructions can include instructions to display information relevant to an availability status of a user of the computing device. The received instructions can include instructions to display information relevant to a power status of the computing device.

DETAILED DESCRIPTION

As described herein, a computing device, such as a laptop or desktop computer can include a dynamic, programmable multi-color light-emitting diode (LED). In one implementation, the multi-color LED indicator may be located on a non-display screen area of the computing device. For example, the multi-color LED indicator may be located on the backside of the display portion of the laptop computer (e.g., opposite to the display portion of the laptop computer) or on the backside of a display apparatus of the personal computer (e.g., opposite to the display portion of the display apparatus). Regardless of the location, the multi-color LED indicator may include a plurality of segments, with each segment being capable of displaying a plurality of colors such as green, yellow, and red, among others. As such, the multi-color LED indicator may simultaneously display multiple colors.

Also, according to the implementations, the dynamic, programmable multi-color LED indicator may be configured to display multiple colors to convey particular information to an observer of the computing device. For example, the multi-color LED indicator can be programmed to display a particular color scheme or sequence of colors that is consistent with a brand associated with the computing device. In another example, the multi-color LED indicator can be programmed by a user or an administrator of the computing device to convey particular information to people in visual contact with the computing device.

Figure 1:
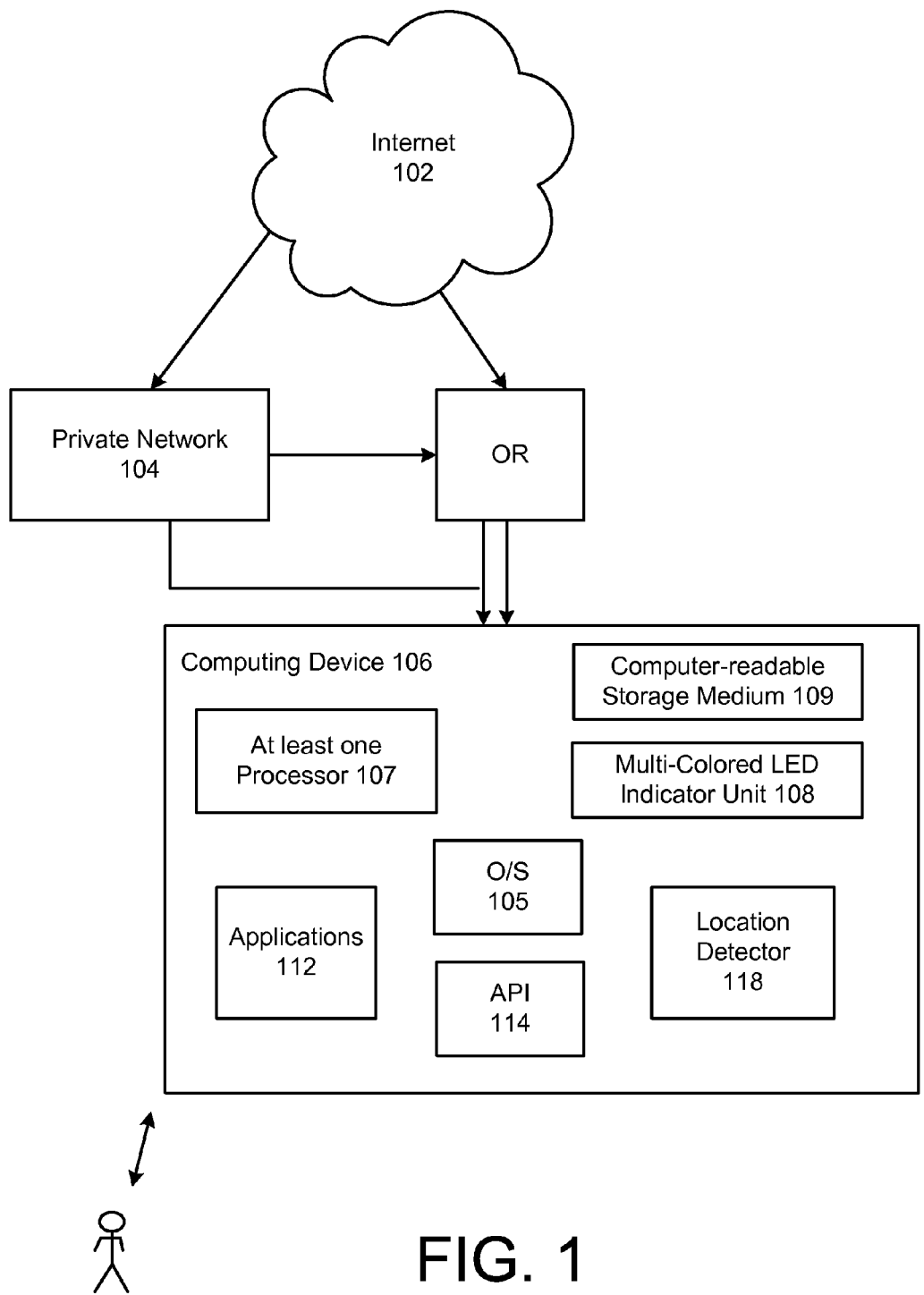
FIG. 1 is a schematic diagram of a computing device that includes a dynamic, programmable multi-color LED indicator.

FIG. 1 illustrates a computing device 106 that includes a dynamic, programmable multi-color LED indicator 108. The computing device 106 may take the form of a laptop computer, a desktop computer, a netbook, a tablet computer, a television, for example. Other forms of the computing device 106 are also possible. An implementation of the computing device 106 as a laptop computer, and an implementation of the computing device 106 as a desktop computer are further illustrated in FIGS. 3A and 3B.

The computing device 106 may include an operating system 105, at least one processor 107, and a non-transitory computer-readable storage medium 109. The non-transitory computer-readable storage medium 109 may include executable instructions, that when executed, cause the at least one processor 107 to implement functionalities of the operating system 105, applications 112, and the multi-color LED indicator 108.

The operating system 105 may include an operating system such as the Windows operating system, Mac OS, Linux, Chrome OS, Android, Symbian, or iPhone OS, to name a few examples. Consequently, the applications 112 may include virtually any application that may run on the underlying operating system 105 or platform. Examples of such applications are well-known and too numerous to mention in any detail, but generally include web browsers, document processing applications, gaming applications, email applications, image editing or presentation software, a web browser, and/or virtually any type of application capable of operating on an operating system.

The applications 112 may include or use, or be associated with, one or more Application Programming Interfaces (APIs) to communicate with the LED indicator 108, where such APIs may be light-weight, consistent, customizable, and easy to implement within or among various applications 112. Moreover, such APIs may rarely, if ever, need to be updated or maintained by the user in order for the user to programmably control the operation and display of the LED indicator 108. Instead, such updates may be managed by an administrator or other provider of the LED indicator 108, or the computing device 106, so that the user of the device 106 is unburdened of associated efforts and responsibilities. The operating system 105, the applications 112, and the APIs 114 may issue commands to control the operation of the LED indicator 108, and the commands are provided to the multi-color LED indictor 108 for displaying the color scheme.

As shown in FIG. 1, the computing device 106 may be capable of being connected to the Internet 102 or a private network 104 that itself is connected to the Internet 102. The private network 104 may represent a corporate or other intranet, and/or a smaller-scale, local or personal network, any of which may be implemented using standard network technology.

Figure 2:
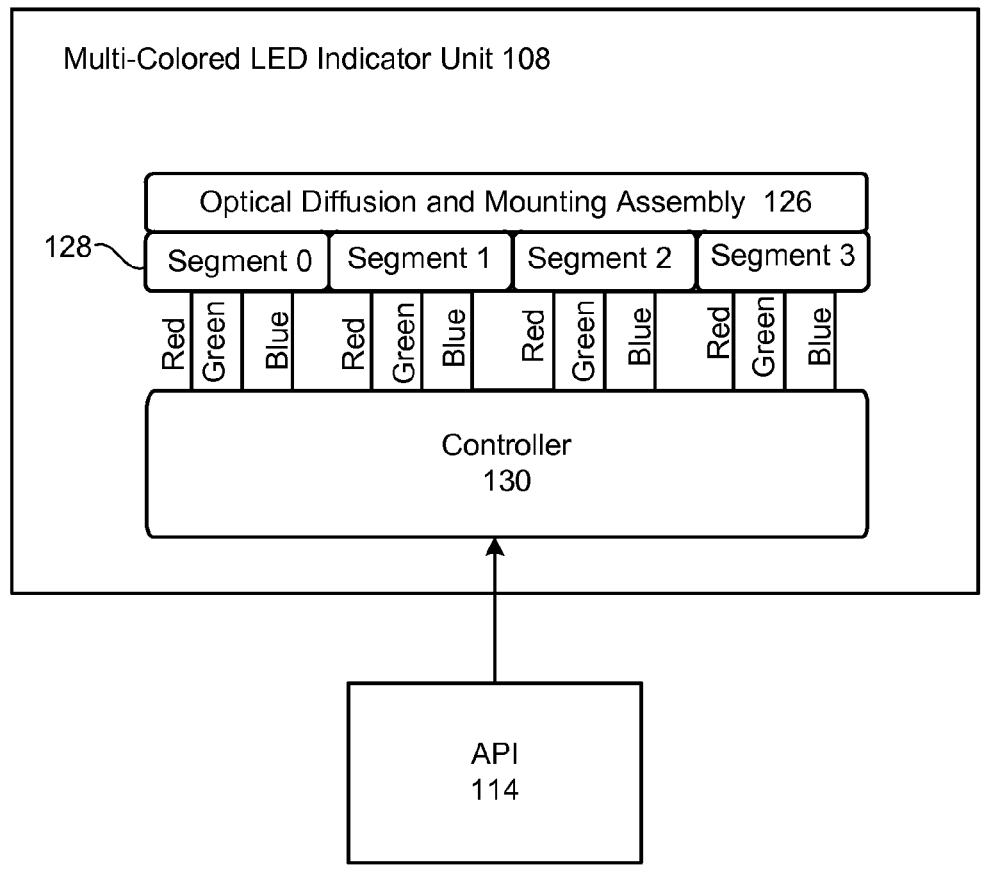
FIG. 2 is a schematic block diagram of the multi-color LED indicator of FIG. 1.

FIG. 2 is a schematic block diagram of the multi-color LED indicator 108 of FIG. 1. According to an implementation, the multi-color LED indicator 108 may include a controller 130, and an optical diffusion and mounting assembly 126 having a plurality of segments. The plurality of segments may include a plurality of independent LED segments such as segment 0, segment 1, segment 2, and segment 3, where each segment is capable of independently displaying a color. Although four segments are shown in FIG. 2, the multi-color LED indicator 108 may include a different number of segments.

Each segment may include different color LEDs. For example, each segment can include a red LED, a green LED, and a blue LED. In some implementations, the colors can be provided separately, such that each segment can display four different colors (e.g., red, green, blue, or black). In other implementations, single level outputs of the different LEDs in a segment can be mixed to produce eight different colors in a segment. In other implementations, the output of the different LEDs can be mixed, and different output levels from the different LEDs can be used, to produce many different colors in a segment. In some implementations, the colors from the LEDs can be mixed to produce at least 64 different colors. In some implementations, the colors from the LEDs can be mixed to produce at least 256 different colors (a.k.a. 8-bit color). In other implementations, the colors from the LEDs can be mixed to produce at least 4096 different colors, at least 32,768 different colors, at least 65,536 different colors, or at least 16 million different colors. As such, the plurality of segments may provide the capability of displaying multiple colors at the same time. The optical diffusion and mounting assembly 126 may include components related to each segment, such as mounting hardware for the red, green, and blue LEDs, electrical and heat-management components, and optical components for diffusing light emitted from the LEDs in the segments 128.

The controller 130 may be an independently-provided controller that is different from the internal controllers associated with controlling single color LEDs on conventional computing devices. The controller 130 may receive commands from operating system 105, the applications, 112, and the APIs 114 and provide the LED-level instructions to the optical diffusion and mounting assembly 126 for displaying the appropriate colors. The LED-level instructions may provide information indicating the appropriate emission pattern(s) for the desired color, brightness, and timing of the individual segments of the LED indicator 108. The LED controller functionality also may also be implemented by the processor 107 executing stored instructions.

As shown in FIG. 2, the multi-color LED indicator 108 may receive commands related to the display of one or more colors of the multi-color indicator to control the illumination of colors. The commands may be in a format or syntax that is recognizable by the controller 130 that controls a light-emitting diode for displaying the appropriate color indicated by the LED display policy. To create a dynamic display using the indicator, the color, brightness, and timing of the light emitted from the segments of the indicator 108 can be controlled with commands issued to the indicator. For example, to create a dynamic pulsing pattern, commands may be issued to the indicator to initially display a first color and then over a first time period to gradually and continuously change the color to a second color while also increasing the brightness of the emitted light, and then over a second time period to gradually and continuously change the color back to the first color while also decreasing the brightness of the emitted light, and then to repeat the process. The color, brightness and timing of light emitted from different segments can be coordinated to display information to the user.

Figure 3A:
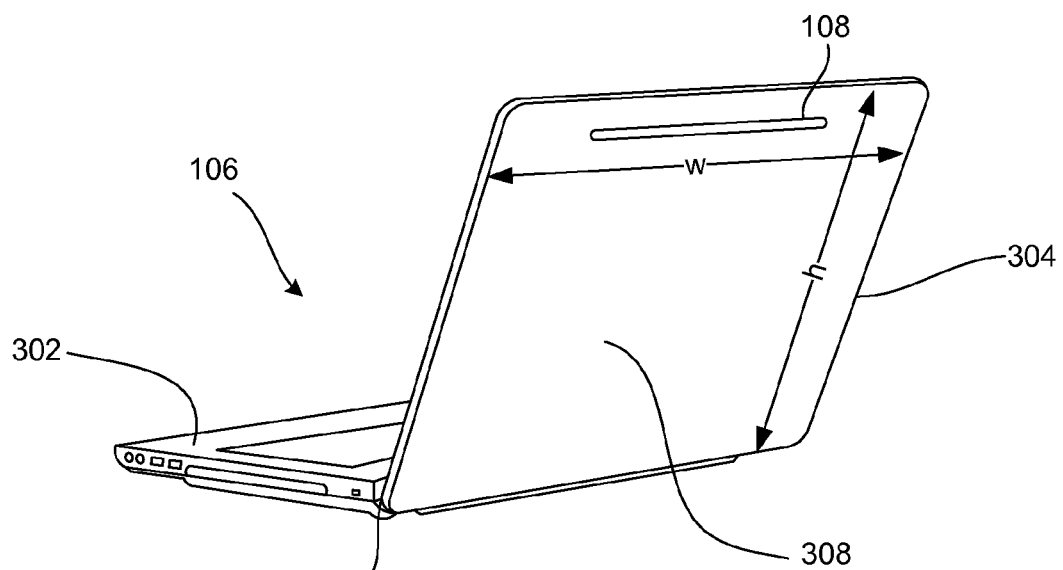
FIG. 3A illustrates the computing device of FIG. 1 configured as a laptop computer.

FIG. 3A illustrates the computing device 106 of FIG. 1 configured as a laptop computer. Referring to FIG. 3A, the laptop computer includes a base portion 302, which may include one or more user input devices (e.g., a keyboard, a trackpad, etc.) and a housing that houses electrical components (e.g., one or more memory devices configured for storing executable instructions, one or more processors configured for executing instructions, etc.) and a display portion 304, which may include a high-resolution display screen (e.g., an LED or LCD display screen) that displays information to a user. The display screen can include a large number of independently-controllable pixels (e.g., greater than 380,000 pixels), where the large number of pixels can be controlled to display text-based information to a user. For example, the display screen can display webpages, electronic documents, etc., and other text-based information to a user. The display portion 304 can be attached to the base portion 302 by a hinge 306, such that the display portion 304 can be placed in a closed position when it is parallel to the base portion 302, and can be opened into an open position by rotating the display portion 304 about an axis defined by the hinge 306 relative to the base portion 302.

As shown in FIG. 3A, the display portion 304 can have a generally thin rectangular shape, such that it has two primary opposed surfaces. A first surface (not shown) that faces the base portion when the display portion is in the closed position can include the high-resolution programmable display screen that is configured to display text-based information to a user. In some implementations, a second surface 308 that is opposite to the first surface (e.g., a backside of the laptop computer) can include the multi-color LED indicator 108. In other implementations, the multi-color LED indicator 108 can be located elsewhere on the laptop computer. For example, the indicator 108 can be located on a surface of the base portion 302, on the first surface of the display portion 304, or on an edge of the base portion or the display portion.

As shown in FIG. 3A, the multi-color indicator 108 can have a generally-rectangular shape, with different segments of the indicator arranged in a line. Individual segments of the indicator 108 also can have generally-rectangular shapes and can be arranged contiguously in a line. In some implementations, the segments of the indicator 108 can be arranged in a single line of segments. In other implementations, the segments of the indicator 108 can be arranged in two or more parallel lines of segments. In some implementations, the length of the generally-rectangular indicator 108 can be at least 50% of the width, w, of the display portion 304. In some implementations, the height of the generally-rectangular indicator 108 can be less than 10% of the height, h, of the display portion 304. In some implementations, the multi-color indicator 108 can have a generally circular shape, with different segments of the indicator having pie-wedge shapes that together form the generally circular shape of the indicator 108. In some implementations, the multi-color indicator 108 can have be generally ring-shaped, with different segments of the indicator having arc shapes that together form the ring shape of the indicator 108.

The computing device 106 can be configured as a tablet computing device, having a display, processing circuitry, a memory device, and a battery integrated in a single unit. The tablet can include a high-resolution, programmable display screen that is configured to display text-based information to a user on one side of the tablet. The multi-color indicator 108 can be provided on an opposite side of the tablet from the high-resolution, programmable display screen.

Figure 3B:
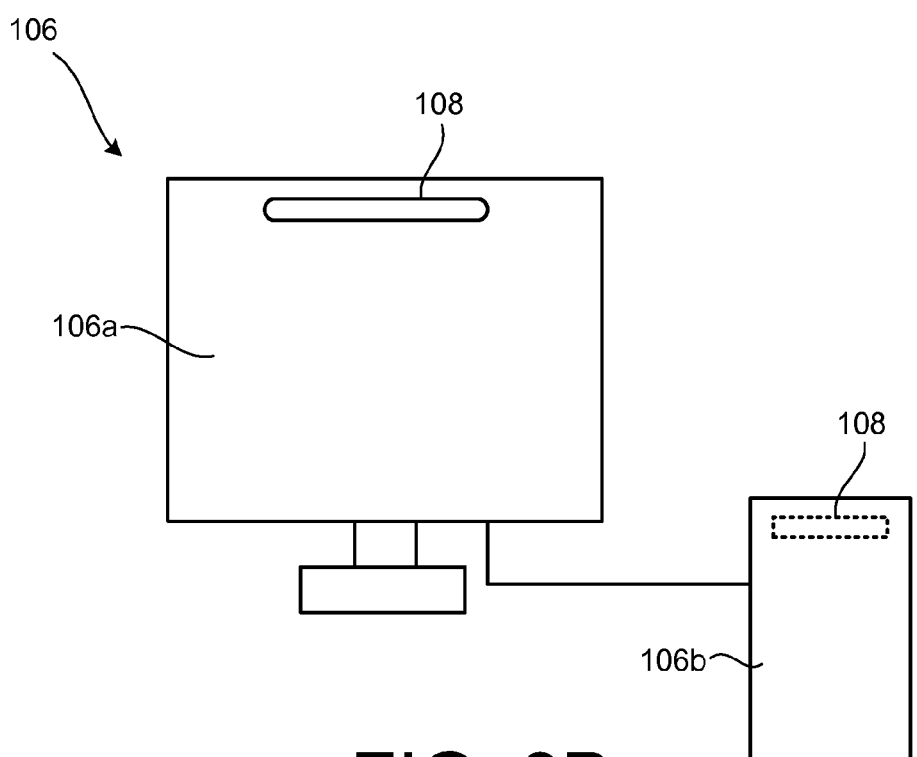
FIG. 3B illustrates the computing device of FIG. 1 configured as a desktop computer.

FIG. 3B illustrates the computing device 106 of FIG. 1 as a desktop computer. Referring to FIG. 3B, the desktop computer may have a display screen apparatus 106a providing a display screen and a computer processing unit (CPU) housing 106b. The display screen may be located on a first surface of the display screen apparatus 106a, and the multi-color indicator 108 may be located on a second surface, which is opposite to the first surface, of the display screen apparatus. In other embodiments, the multi-color indicator 108 may be located on the first surface of the display screen apparatus 106a. In other embodiments, the multi-color LED indicator 108 may be located on a surface of a housing 106b that includes computing components other than the display screen (e.g., a central processing unit, a disk drive, etc.). In some embodiments, the desktop computer may include a single housing that includes the display screen apparatus and computing components such as, for example, a central processing unit a disk drive, etc.

Figure 4:
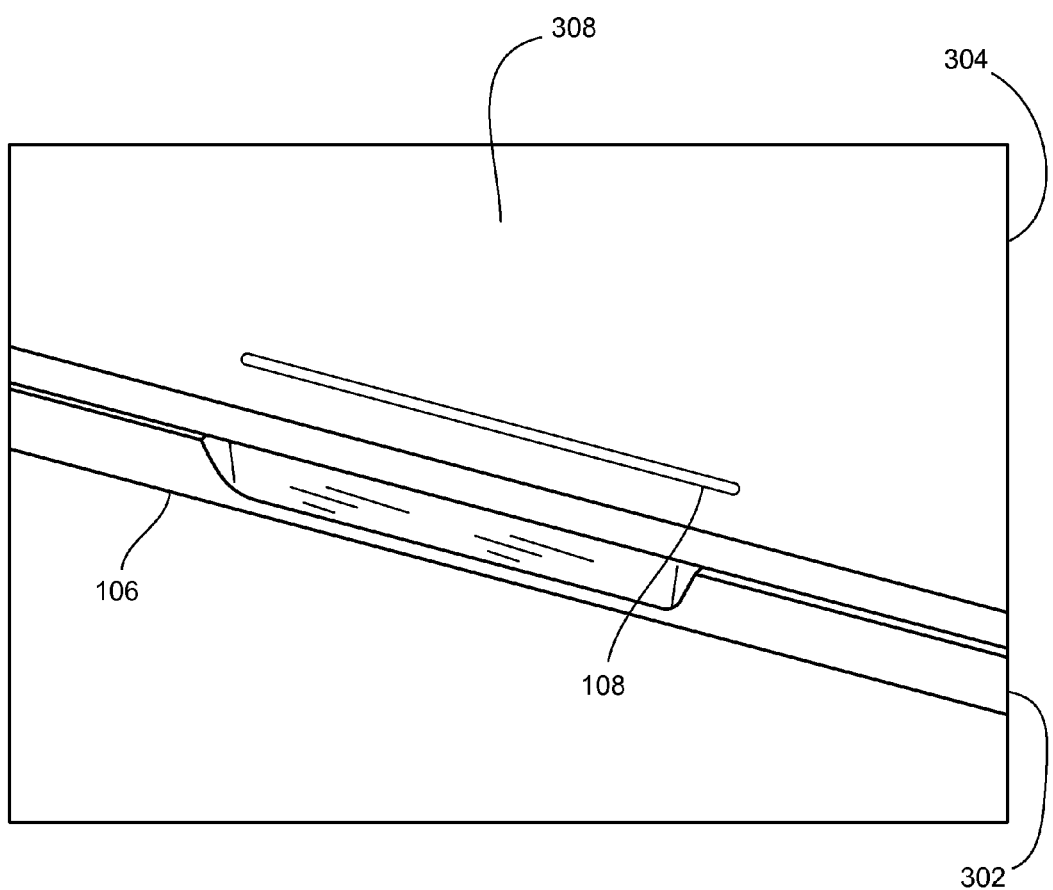
FIG. 4 illustrates the computing device of FIG. 1 according to another implementation.

FIG. 4 illustrates the computing device 106 of FIG. 1 according to another implementation. For example, FIG. 4 illustrates the computing device 106 as the laptop computer, with the laptop computer being in a closed state (e.g., where the display portion 304 and the base portion 302 are folded together, such that the first surface of the display portion that includes the display screen faces the base portion). As shown in FIG. 4, the multi-color LED indicator 108 is located on the second, backside surface 308 of the computer, towards the outer edge of the laptop computer. Again, the locations of the multi-color LED indicator 108, as shown in FIGS. 3A, 3B, and 4, are merely examples, where the implementations encompass any location of the multi-color LED indicator 108 on the computing device 106.

Referring again to FIG. 1, the multi-color LED indicator 108 is programmable to display non-text-based information in response to instructions received from the operating system 105, applications 112 and the APIs 114. The indicator 108 can be programmable directly by a user of the computing device 106. In some implementations, certain programmability of the indicator 108 can be inaccessible to a general user of the computing device, while the certain programmability can be available to a user with special credentials. For example, certain displays of the indicator can be programmed when the device is configured by a manufacturer of the device, and it may not be possible to unprogram these displays after the device has been delivered to an end-user. In another example, certain displays of the indicator 108 can be programmed only by a user having system administrator credentials within an organization that owns the computing device, and the certain displays cannot be unprogrammed by a general user of the device.

In some examples, the multi-color LED indicator 108 can be programmed to display a pattern of light that corresponds to a brand associated with the computing device. For example, if the computing device 106 belongs to an educational institution, the indicator 108 can be programmed to display an illumination pattern that corresponds to colors associated with the educational institution. For example, a computing device 106 that belongs to the University of North Carolina can have its indicator 108 be programmed to display a "Carolina blue" pattern, a computing device that belongs to the University of California, Los Angeles can have its indicator 108 be programmed to display a "True Blue and gold" pattern, and a computing device that belongs to Harvard University can have its indicator 108 be programmed to display a crimson pattern, etc.

The indicator 108 can be programmed to display the colors associated with the educational institution at particular times, but can be programmed to display other colors and displays at other times. For example, the indicator can be programmed by a manufacturer of the device 106 or by a system administrator of the device to display the colors associated with the educational institution for a period of time (e.g., 1 minute) when the device is turned on or returned to a full power state from a sleep state, but at other times the information displayed by the indicator 108 can be programmed by an end user of the device 106. In another implementation, the indicator 108 can be programmed by a system administrator of the device to display the colors associated with the educational institution for a period of time on significant days for the educational institution, such as, for example, a graduation day, or on days on which the institution's significant athletic teams compete in significant athletic contests. At other times, the information displayed by the indicator 108 can be programmed by an end user of the device 106.

In another example, the indicator 108 can be programmed to display a color pattern representing a company associated with the computing device 106. For example, if the computing device 106 is owned by IBM, the indicator 108 can be programmed to display a blue and/or a blue-and-white color scheme associated with the IBM brand, if the device 106 is owned by Coca-Cola, the indicator 108 can be programmed to display a red and/or a red and white color scheme associated with the Coca-Cola brand, and if the device 106 is owned by Google, the indicator 108 can be programmed to display the primary colors associated with the Google brand.

The color schemes associated with an organization that owns or is associated with the computing device 106 can be displayed in a dynamic manner. For example, the color scheme associated with the organization can be displayed for a short period of time (e.g., 30 seconds) when the device 106 is turned on or turned off or when the device is placed into a sleep mode or is taken out of a sleep mode. In addition, the color schemes associated with the organization can be dynamic in that they can blink on and off, can repeatedly pulse from a relatively low brightness gradually to a relatively high brightness and then back to the relatively low brightness, etc. After the display of the colors associated with the organization is completed, the indicator 108 can then be used to display other non-text based information to a user.

Programming of the indicator 108 is facilitated by the API 114 that translates executable instructions into commands that directly control the color, brightness, timing, etc. of the segments of the indicator 108. In some implementations, the executable instructions can be a snippet of scripting language code (e.g., JavaScript). The scripting language code can be downloaded to the computing device 106 from the Internet 102 or from the private network 104, and then the instructions that the code can be applied to the indicator 108 via the API 114. In response to application of the instructions, non-text-based information can be displayed by the multi-segment, multi-color indicator 108. For example, when the user executes a browser application 112 and navigates to a webpage, scripting language code for programming the display of the indicator 108 may be downloaded from the webpage. In particular examples, when the user navigates to a Coca-Cola.com top-level domain webpage, code could be downloaded from the webpage to cause the indicator 108 to display a color scheme (e.g., a red and white color scheme) associated with the Coca-Cola Company, or when a user navigates to a webpage associated with the San Francisco 49ers football team (e.g., a webpage having a 49ers.com top-level domain), code can be downloaded from the webpage to program the indicator 108 to display the scarlet and gold color scheme associated with the 49ers football team. Policies may be defined and implemented on the computing device 106 to allow code only from certain predefined locations to the downloaded and executed to program the indicator 108. For example, on a computing device owned by an organization, a policy may be defined and implemented to allow code only from locations associated with the organization (e.g. the organization's intranet) to be downloaded and executed to program the indicator 108. In another example, a computing device 106 owned by an individual, the individual may define particular sites or domains that are allowed to download, or that are prohibited from downloading, code that may be executed to program the indicator 108.

In another implementation, executable code can be used to program the indicator 108 to display non-text-based information in order to convey a novel, whimsical, or interesting impression on a user of the computing device. In some cases, the impression can be associated with the device or with a website or organization from which the code is downloaded. For example, code can be downloaded to program the indicator 108 to display themes appropriate for a particular day, such as for example, green on St. Patrick's Day; orange and black on Halloween; and red, white, and blue on Independence Day (July 4) when the device is in the United States or used by an American user, or on Bastille Day (July 14) when the device is in France is used by a French user. The user may find such color "themes" to be compelling or interesting, which may engender a favorable association with the device 106 or with a website or organization from which code for displaying such themes is downloaded.

The indicator 108 can be used to display a variety of non-text-based information. For example, the indicator may be programmed to indicate a power status of the computing device 106. In one example, when the indicator 108 has a generally rectangular shape, and when the device 106 is connected to a power source to charge a battery of the device, different segments of the rectangular indicator can be repeatedly illuminated sequentially in a blue color from a first end of the indicator to a second end of the indicator 108 to create a sweeping pulse of color to indicate that the device 106 is being charged. The distance over which the rectangular indicator is repeatedly illuminated can indicate the charge status of the device. For example, repeated sequential elimination of the rectangle extending 50% across the entire rectangle from the first end can indicate that the device 106 is charged to 50% of its capacity, and repeated sequential illumination of the rectangle extending 75% across the entire rectangle from the first end can indicate that the device 106 is charged to 75% of its capacity.

When the device 106 is not connected to a power source and is being used, different segments of the indicator can be repeatedly illuminated sequentially in a red color toward the first end of the rectangular indicator to create a sweeping pulse of color to indicate that the device 106 is consuming energy from its battery and that the battery is discharging. The distance over which the rectangular indicator is repeatedly illuminated can indicate the charge status of the device. For example, repeated sequential elimination of the rectangle extending 50% across the entire rectangle toward the first end can indicate that the device 106 is charged to 50% of its capacity, and repeated sequential elimination of the rectangle extending 25% across the entire rectangle toward the first end can indicate that the device 106 is charged to 25% of its capacity.

In some implementations, the rectangular indicator 108 can be oriented toward an AC adapter connection on the computing device, and a blue sweeping pulse of color on the indicator away from the AC adapter connection can indicate that the battery of the device 106 is discharging, while a red sweeping pulse of color on the indicator toward the AC adapter connection can indicate the battery of the device is discharging.

In some implementations, the indicator can be programmed to display information about network data usage of the computing device 106. For example, if the user has a data plan that is limited to a maximum number of bytes per month, and the user is getting close to the maximum number, the indicator 108 can be programmed to display a color pattern indicating a warning regarding the network data usage by the user. Such a warning may be displayed by the indicator 108 only when the device 106 is utilizing network bandwidth at a rate that exceeds a threshold rate. In this manner, a user of the device 106 can be alerted when the device is experiencing relatively high network data usage, which may result in the user exceeding the threshold number of bytes per month, so that the user may investigate which applications or services on the device, of which the user may be unaware, are consuming network bandwidth.

In some implementations, the indicator 108 can be programmed to display an availability status of a user of the computing device 106. For example, a green indicator can indicate that the user is available to participate in oral, phone, Chat/Instant Messaging, etc. communications; a yellow indicator can indicate that the user is busy and does not want to be interrupted; and a red indicator can indicate that the user is not available. Such an indicator can be helpful in an open office environment, in which employees work from wall-less cubicles.

In another implementation, the indicator 108 can be programmed to display an indication that the computing device 106 has a live microphone that is currently detecting and transmitting sounds from the immediate environment of the device. For example, the indicator 108 may be programmed to blink orange when the microphone of the device 106 is live. Such an indication may be helpful to alert passersby of the device 106 when a user of the device 106 is using the device to communicate with a remote person, so that the passersby do not accidentally contribute embarrassing, annoying, or confidential information over the live microphone.

In some implementations, the indicator 108 can be used to indicate the presence of email, chat, phone, etc. communications that the user has received. For example, a first color may indicate the presence of a first type of communication (e.g., an email), a second color may indicate the presence of a second type of communication (e.g., a voicemail), etc. On a rectangular shaped indicator, a length of a colored bar indicating the presence of a communication of a particular type can indicate a volume of communications of the particular type (e.g., a number of new emails in the user's inbox). A blinking color may indicate the presence of an urgent communication, where the color indicates a particular type of communication.

A user may program the indicator to display information about particular messages that are of particular importance to the user. For example, the user can program the indicator 108 to display a notification indicating the presence of a communication from a particular person (e.g., a boss or a family member), while programming the indicator not to display notifications of communications from other people. A user may program the indicator to display notifications based on other filter, too.

In some implementations, the indicator 108 can be programmed to provide notifications of events a user has listed in a calendar application. For example, the indicator 108 can be programmed to provide a notification having a particular color, timing, and brightness to indicate that a calendared event is scheduled to begin soon. If the device 106 includes a location sensor 118 (e.g., based on GPS or based on sensing proximity to Wi-Fi base stations having known locations), the time at which the notification is displayed on the indicator 108 can be based on an estimated time for the user to travel from their present location to the location of the calendared event.

In another implementation, the indicator 108 can be programmed to provide non-text-based information relevant to a gaming application that is executed on the computing device 106. For example, the indicator 108 can be programmed to display information such as a number of points scored (e.g., by virtue of a length of a bar of light displayed within a rectangular lee shaped indicator), a number of lives remaining (e.g., by virtue of a number of segments of the indicator thing illuminated), and/or by simple animations.

In another implementation, the indicator 108 can be programmed to function as a kind of timer that provides a visual, non-text-based indication of an amount of time remaining before a predetermined amount of time expires. For example, if a timer is set for a predetermined time, the indicator 108 can be programmed to display a green color after the timer starts, to display a yellow color after a first threshold time has elapsed, and to display a red light when a second threshold time has elapsed. The threshold times can be absolute values or can be defined as percentages of the predetermined time for which the timer is set. Using the indicator 108 has a timer in this manner can be useful, for example, when a speaker is giving a presentation to an audience and the computing device is proximate to the speaker, so that the audience can easily see how much time allotted for the presentation remains.

In another implementation, the indicator 108 can be used in a meeting, when participants of the meeting have computing devices that include such an indicator 108, to indicate which participant has control over presenting slides that are displayed for review by participants of the meeting. When participants of the meeting have devices that are connected to a common network, information can be exchanged between the devices to indicate which one of the participants is currently the presenter of the slides. The device that is presenting the slides can have an indicator 108 that is programmed to display a different color scheme than the other devices to indicate that it is the device that is controlling the presentation of the slides.

In another implementation, the indicator 108 can be programmed to display non-text-based information about the current time and/or weather in the location of the computing device. For example, the indicator 108 can be programmed to fade into twilight colors at dusk and to dimly lit colors as night falls. For example, the indicator 108 can be programmed to display colors representing current weather in the location of the computing device. For example, the indicator 108 can be programmed to display a blue background with a yellow circle to indicate sunny weather, a blue background with white spots to indicate cumulus clouds, light gray to indicate overcast conditions, dark gray and/or dark gray with streaks of silver to indicate falling rain, dark gray with flashes of white to indicate thunder and lightning, etc. In some implementations, the indicator can be programmed to display information about a current time and/or weather in a location different from the current location of the computing device. For example, a user traveling with his or her computing device 106 can program the indicator 108 to display non-text-based information about the current weather at his or her home rather than at his or her current location.

In another example, non-text-based information can be displayed on the indicator 108 about the status of a home or building. For example, when the indicator 108 is used to display information about a user's home automation setup, one segment of the indicator 108 can be illuminated in red to indicate that a heater is on or could be illuminated in blue to indicate that an air conditioner is on, or could take on a range of colors to indicate a temperature of the house (e.g., from deep blue for very cold to deep red for very hot). Another segment can be used to indicate the status of an alarm system (e.g., green for armed, yellow for unarmed, and flashing red for alarm violation). Another segment can be used to indicate the status of a data network used in the home (e.g., from green for a relatively low traffic over the network to red for relatively high traffic). The computing device 106 can receive information about the status of a user's home automation setup over a network and can display information about the setup with the indicator 108, even when the computing device is not local to the user's home.

As described herein, the indicator 108 can be programmed to display a wide variety of non-text-based information. The indicator 108 can be programmed to display information according to instructions developed in accordance with an enterprise policy to display information relevant to the interests of an enterprise or organization associated with the computing device. The indicator 108 can be programmed to display information according to instructions provided by a system administrator who may have privileges beyond those of an end user of the device. The indicator 108 can be programmed to display information according to a user preference (e.g., to display information about weather of the location preferred by a user). The indicator 108 can be programmed to display information about an application setting (e.g., to display information relevant to a game application).

Figure 5:
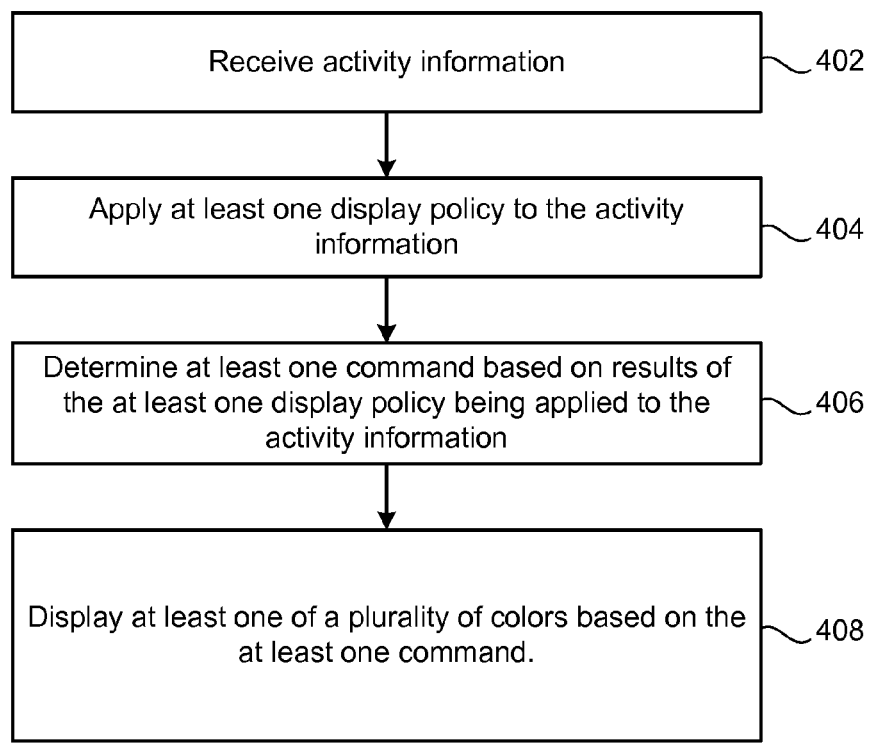
FIG. 5 is a flowchart illustrating example operations of the computing device of FIG. 1.

FIG. 5 is a flowchart illustrating example operations of the computing device 106 of FIG. 1. In particular, the flow chart illustrates a process 500 of displaying non-text-based information via a multi-segment, multi-color indicator of a computing device located on a surface of the computing device that does not include a programmable display screen configured to display text-based information.

In the process 500, instructions are received from an application executing on the computing device (502). In some implementations, the application can be a browser application or an operating system application. The instructions are applied to the indicator via an API (504). In response to the application of the instruction, non-text-based information is displayed by the multi-segment, multi-color indicator (506).

Figure 6:
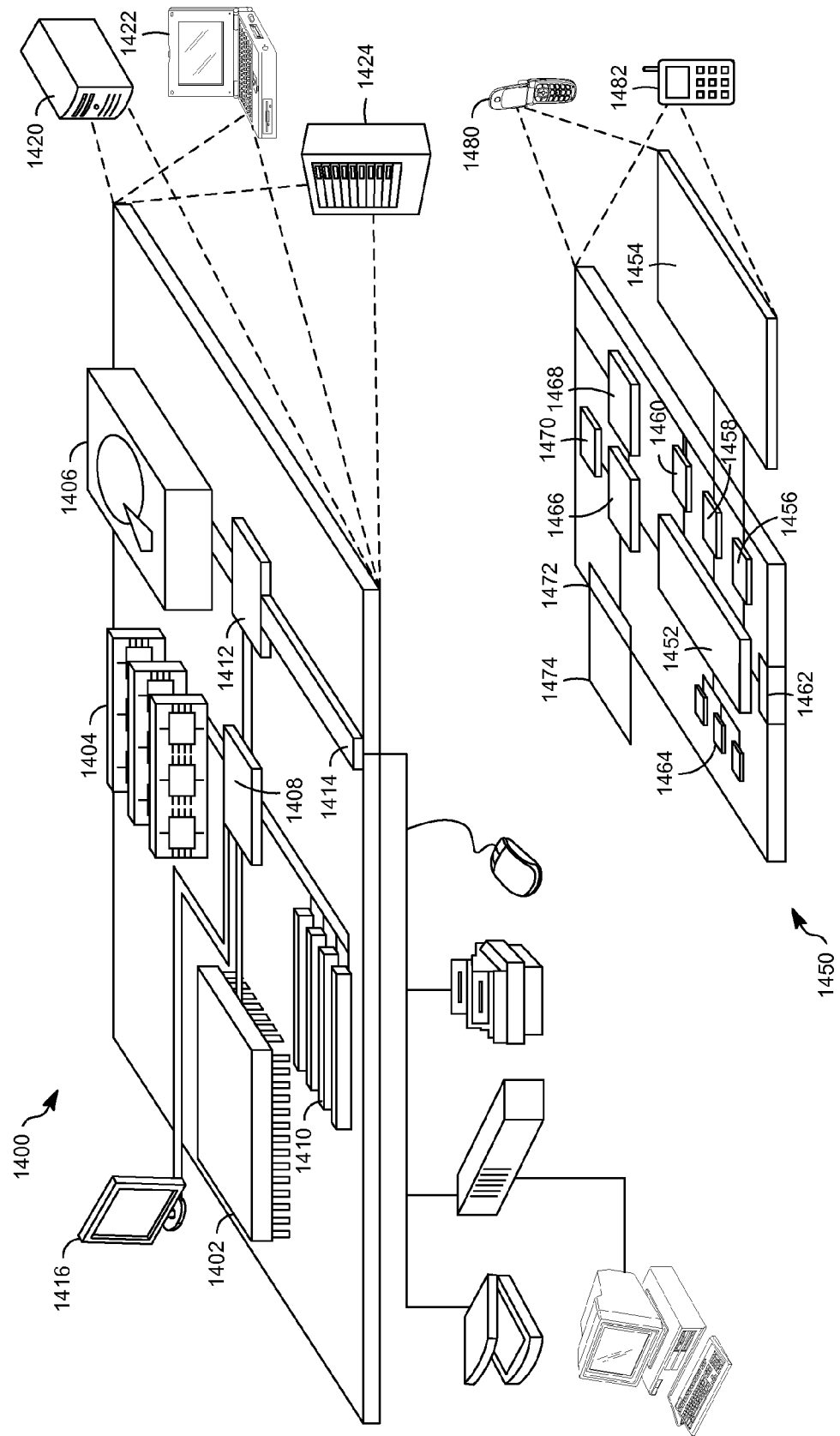
FIG. 6 shows an example of a computer device and a mobile computer device that can be used to implement the techniques described here.

FIG. 6 shows an example of a computer device 1400 and a mobile computer device 1450, which may be used with the techniques described here. Computing device 1400 is intended to represent various forms of digital computers, such as laptops, desktops, workstations, personal digital assistants, servers, blade servers, mainframes, and other appropriate computers. Computing device 1450 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 1400 includes a processor 1402, memory 1404, a storage device 1406, a high-speed interface 1408 connecting to memory 1404 and high-speed expansion ports 1410, and a low speed interface 1412 connecting to low speed bus 1414 and storage device 1406. Each of the components 1402, 1404, 1406, 1408, 1410, and 1412, are interconnected using various busses, and may be mounted on a common motherboard or in other manners as appropriate. The processor 1402 can process instructions for execution within the computing device 1400, including instructions stored in the memory 1404 or on the storage device 1406 to display graphical information for a GUI on an external input/output device, such as display 1416 coupled to high speed interface 1408. In other implementations, multiple processors and/or multiple buses may be used, as appropriate, along with multiple memories and types of memory. Also, multiple computing devices 1400 may be connected, with each device providing portions of the necessary operations (e.g., as a server bank, a group of blade servers, or a multi-processor system).

The memory 1404 stores information within the computing device 1400. In one implementation, the memory 1404 is a volatile memory unit or units. In another implementation, the memory 1404 is a non-volatile memory unit or units. The memory 1404 may also be another form of computer-readable medium, such as a magnetic or optical disk.

The storage device 1406 is capable of providing mass storage for the computing device 1400. In one implementation, the storage device 1406 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 1404, the storage device 1406, or memory on processor 1402.

The high speed controller 1408 manages bandwidth-intensive operations for the computing device 1400, while the low speed controller 1412 manages lower bandwidth-intensive operations. Such allocation of functions is exemplary only. In one implementation, the high-speed controller 1408 is coupled to memory 1404, display 1416 (e.g., through a graphics processor or accelerator), and to high-speed expansion ports 1410, which may accept various expansion cards (not shown). In the implementation, low-speed controller 1412 is coupled to storage device 1406 and low-speed expansion port 1414. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 1400 may be implemented in a number of different forms, as shown in the figure. For example, it may be implemented in a personal computer such as a laptop computer 1422 or a tablet computer. Alternatively, components from computing device 1400 may be combined with other components in a mobile device (not shown), such as device 1450. Each of such devices may contain one or more of computing device 1400, 1450, and an entire system may be made up of multiple computing devices 1400, 1450 communicating with each other.

Computing device 1450 includes a processor 1452, memory 1464, an input/output device such as a display 1454, a communication interface 1466, and a transceiver 1468, among other components. The device 1450 may also be provided with a storage device, such as a microdrive or other device, to provide additional storage. Each of the components 1450, 1452, 1464, 1454, 1466, and 1468, are interconnected using various buses, and several of the components may be mounted on a common motherboard or in other manners as appropriate.

The processor 1452 can execute instructions within the computing device 1450, including instructions stored in the memory 1464. The processor may be implemented as a chipset of chips that include separate and multiple analog and digital processors. The processor may provide, for example, for coordination of the other components of the device 1450, such as control of user interfaces, applications run by device 1450, and wireless communication by device 1450.

Processor 1452 may communicate with a user through control interface 1458 and display interface 1456 coupled to a display 1454. The display 1454 may be, for example, a TFT LCD (Thin-Film-Transistor Liquid Crystal Display) or an OLED (Organic Light Emitting Diode) display, or other appropriate display technology. The display interface 1456 may comprise appropriate circuitry for driving the display 1454 to present graphical and other information to a user. The control interface 1458 may receive commands from a user and convert them for submission to the processor 1452. In addition, an external interface 1462 may be provide in communication with processor 1452, so as to enable near area communication of device 1450 with other devices. External interface 1462 may provide, for example, for wired communication in some implementations, or for wireless communication in other implementations, and multiple interfaces may also be used.

The memory 1464 stores information within the computing device 1450. The memory 1464 can be implemented as one or more of a computer-readable medium or media, a volatile memory unit or units, or a non-volatile memory unit or units. Expansion memory 1474 may also be provided and connected to device 1450 through expansion interface 1472, which may include, for example, a SIMM (Single In Line Memory Module) card interface. Such expansion memory 1474 may provide extra storage space for device 1450, or may also store applications or other information for device 1450. Specifically, expansion memory 1474 may include instructions to carry out or supplement the processes described above, and may include secure information also. Thus, for example, expansion memory 1474 may be provide as a security module for device 1450, and may be programmed with instructions that permit secure use of device 1450. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 1464, expansion memory 1474, or memory on processor 1452, that may be received, for example, over transceiver 1468 or external interface 1462.

Device 1450 may communicate wirelessly through communication interface 1466, which may include digital signal processing circuitry where necessary. Communication interface 1466 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 1468. In addition, short-range communication may occur, such as using a Bluetooth, WiFi, or other such transceiver (not shown). In addition, GPS (Global Positioning System) receiver module 1470 may provide additional navigation- and location-related wireless data to device 1450, which may be used as appropriate by applications running on device 1450.

Device 1450 may also communicate audibly using audio codec 1460, which may receive spoken information from a user and convert it to usable digital information. Audio codec 1460 may likewise generate audible sound for a user, such as through a speaker, e.g., in a handset of device 1450. Such sound may include sound from voice telephone calls, may include recorded sound (e.g., voice messages, music files, etc.) and may also include sound generated by applications operating on device 1450.

The computing device 1450 may be implemented in a number of different forms, as shown in the figure. For example, it may be implemented as a cellular telephone 1480. It may also be implemented as part of a smart phone 1482, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

It will be appreciated that the above implementations that have been described in particular detail are merely example or possible implementations, and that there are many other combinations, additions, or alternatives that may be included.

Also, the particular naming of the components, capitalization of terms, the attributes, data structures, or any other programming or structural aspect is not mandatory or significant, and the mechanisms that implement the invention or its features may have different names, formats, or protocols. Furthermore, the system may be implemented via a combination of hardware and software, as described, or entirely in hardware elements. Also, the particular division of functionality between the various system components described herein is merely exemplary, and not mandatory; functions performed by a single system component may instead be performed by multiple components, and functions performed by multiple components may instead performed by a single component.

Some portions of above description present features in terms of algorithms and symbolic representations of operations on information. These algorithmic descriptions and representations may be used by those skilled in the data processing arts to most effectively convey the substance of their work to others skilled in the art. These operations, while described functionally or logically, are understood to be implemented by computer programs. Furthermore, it has also proven convenient at times, to refer to these arrangements of operations as modules or by functional names, without loss of generality.

Unless specifically stated otherwise as apparent from the above discussion, it is appreciated that throughout the description, discussions utilizing terms such as "processing" or "computing" or "calculating" or "determining" or "displaying" or "providing" or the like, refer to the action and processes of a computer system, or similar electronic computing device, that manipulates and transforms data represented as physical (electronic) quantities within the computer system memories or registers or other such information storage, transmission or display devices.

What is claimed is:

1. A computing device, comprising:
   a memory storing executable instructions;
   a processor configured to execute the instructions;
   a programmable display screen configured to display text-based information; and
   a multi-color indicator, located on a surface of the computing device, wherein the multi-color indicator includes a plurality of segments, each segment configured to display at least four different colors; and wherein colors displayed by segments of the multi-color indicator are programmable, through execution of the instructions by the processor, to display non-text-based information, and wherein the color, timing and brightness of light emitted from different ones of the plurality of segments are coordinated, through execution of the instructions by the processor, to display the non-text-based information.

2. The computing device of claim 1, wherein the surface does not include the programmable display screen.

3. The computing device of claim 1, wherein the computing device is a laptop computer that includes a base portion and a display portion, the display portion having a first surface that includes the programmable display screen and having a second surface opposite to the first surface that includes the multi-color indicator.

4. The computing device of claim 1, wherein the computing device includes a display screen apparatus having a first surface that includes the programmable display screen and having a second surface opposite to the first surface that includes the multi-color indicator.

5. The computing device of claim 1, wherein the plurality of segments are each generally-rectangular and wherein the plurality of segments are arranged in a line.

6. The computing device of claim 1, wherein the plurality of segments are generally-rectangular and wherein the plurality of segments are arranged in a line.

7. The computing device of claim 6, wherein the plurality of segments are contiguous in the line.

8. The computing device of claim 6, wherein the computing device is a laptop computer that includes a base portion and a display portion, the display portion having a first surface that includes the programmable display screen and having a second surface opposite to the first surface that includes the multi-color indicator, and wherein the line of segments spans has a length that is greater than 50% of a width of the display portion.

9. The computing device of claim 8, wherein the line of segments has a height that is less than 10% of height of the display portion.

10. The computing device of claim 1, wherein the instructions include an Application Programming Interface to allow a user of the computing device to program the display of the multi-color indicator.

11. The computing device of claim 1, wherein the instructions include scripting language code, which, when executed by the processor, program the display of the multi-color indicator.

12. The computing device of claim 1, wherein execution of the instructions by the processor provides different levels of control of the display of the multi-color indicator to different types of users of the computing device.

13. The computing device of claim 1, wherein a timing of the colors of displayed by the segments of the multi-color indicator are programmable, through execution of the instructions by the processor, to display non-text-based information.

14. The computing device of claim 1, wherein each segment is configured to display at least eight different colors.

15. The computing device of claim 1, wherein each segment is configured to display at least 256 different colors.

16. A method of displaying non-text-based information via a multi-segment, multi-color indicator of a computing device located on a surface of the computing device that does not include a programmable display screen configured to display text-based information, the method comprising:
   receiving instructions from an application executing on the computing device, the instructions including instructions to control colors, timing and brightness of light emitted from different ones of the segments and to coordinate the control of the light emitted from the different segments to display the non-text-based information;
   applying the instructions to the indicator via an API; and
   in response to the application of the instruction, displaying, by the multi-segment, multi-color indicator, the non-text-based information.

17. The method of claim 16, wherein the received instructions include instructions to display information representing a brand associated with the computing device.

18. The method of claim 16, wherein the received instructions include instructions to display information relevant to a gaming application executed by the computing device.

19. The method of claim 16, wherein the received instructions include instructions to display information relevant to an operating status of the computing device.

20. The method of claim 16, wherein the received instructions include instructions to display information relevant to an availability status of a user of the computing device.

21. The method of claim 16, wherein the received instructions include instructions to display information relevant to a power status of the computing device.

* * * * *